(12) United States Patent
Wei et al.

(10) Patent No.: US 12,604,631 B2
(45) Date of Patent: Apr. 14, 2026

(54) DISPLAY BACKPLANE, METHOD FOR MANUFACTURING THE SAME, AND DISPLAY APPARATUS

(71) Applicants: Yunnan Invensight Optoelectronics Technology Co., Ltd., Yunnan (CN); BOE Technology Group Co., Ltd., Beijing (CN)

(72) Inventors: Junbo Wei, Beijing (CN); Zhijian Zhu, Beijing (CN); Shengji Yang, Beijing (CN); Pengcheng Lu, Beijing (CN); Kuanta Huang, Beijing (CN); Yuanlan Tian, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 401 days.

(21) Appl. No.: 18/271,455

(22) PCT Filed: Oct. 22, 2021

(86) PCT No.: PCT/CN2021/125611
§ 371 (c)(1),
(2) Date: Jul. 9, 2023

(87) PCT Pub. No.: WO2022/199005
PCT Pub. Date: Sep. 29, 2022

(65) Prior Publication Data
US 2024/0090295 A1      Mar. 14, 2024

(30) Foreign Application Priority Data

Mar. 25, 2021    (CN) ......................... 202110321371.X

(51) Int. Cl.
| | | |
|---|---|---|
| *H10K 59/35* | (2023.01) | |
| *H10K 59/12* | (2023.01) | |
| *H10K 59/131* | (2023.01) | |

(52) U.S. Cl.
CPC ....... *H10K 59/353* (2023.02); *H10K 59/1201* (2023.02); *H10K 59/131* (2023.02)

(58) Field of Classification Search
CPC ............ H10K 59/353; H10K 59/1201; H10K 59/131; H10K 59/121; H10K 59/351
See application file for complete search history.

(56) References Cited

U.S. PATENT DOCUMENTS

| | | | |
|---|---|---|---|
| 2017/0025593 A1* | 1/2017 | Bower | H10H 29/142 |
| 2017/0338438 A1 | 11/2017 | Kwon et al. | |

(Continued)

FOREIGN PATENT DOCUMENTS

| | | |
|---|---|---|
| CN | 109273502 A | 1/2019 |
| CN | 110098247 A | 8/2019 |

(Continued)

OTHER PUBLICATIONS

PCT/CN2021/125611 international search report.

*Primary Examiner* — J.E. Schoenholtz
(74) *Attorney, Agent, or Firm* — IPro, PLLC

(57) ABSTRACT

A display backboard includes a base substrate and a plurality of real pixel units periodically arranged on one side of the base substrate. Each real pixel unit has a plurality of real light-emitting layers with different colors, at least two real metal wiring layers are provided on one side of each real light-emitting layer proximal to the base substrate, and two real metal wiring layers on the side of each real light-emitting layer are electrically connected through via holes. Orthographic projections of the two real metal wiring layers on the side of each real light-emitting layer on the base substrate cover an orthographic projection of at least one of (Continued)

the via holes on the base substrate, and the via holes are configured to connect two virtual metal wiring layers in a virtual pixel unit different from the real pixel unit.

20 Claims, 8 Drawing Sheets

(56)                    References Cited

U.S. PATENT DOCUMENTS

| | | | |
|---|---|---|---|
| 2020/0098838 A1 | 3/2020 | Luo | |
| 2021/0020664 A1* | 1/2021 | Tan | G09G 3/20 |
| 2021/0043616 A1* | 2/2021 | Jung | H10H 20/01 |
| 2022/0069027 A1 | 3/2022 | Wang et al. | |
| 2022/0149024 A1* | 5/2022 | Jia | G09F 9/335 |
| 2022/0262889 A1 | 8/2022 | Song et al. | |
| 2022/0384542 A1 | 12/2022 | Wang et al. | |

FOREIGN PATENT DOCUMENTS

| | | |
|---|---|---|
| CN | 110690234 A | 1/2020 |
| CN | 111584757 A | 8/2020 |
| CN | 111799320 A | 10/2020 |
| CN | 113078194 A | 7/2021 |

* cited by examiner

21 —

55

23b          23a          22

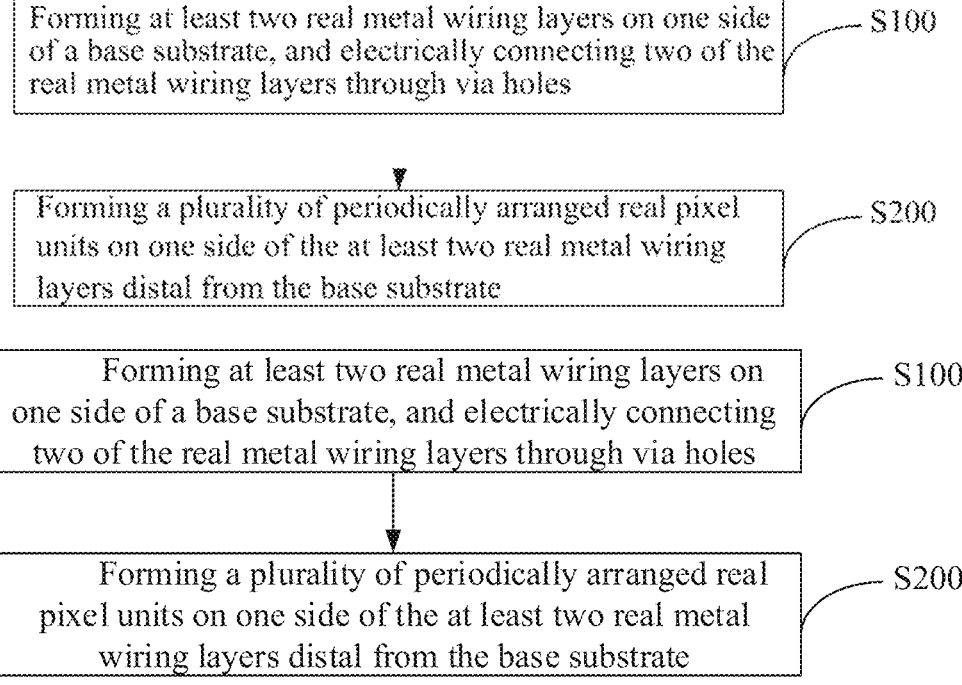

Forming at least two real metal wiring layers on one side of a base substrate, and electrically connecting two of the real metal wiring layers through via holes — S100

Forming a plurality of periodically arranged real pixel units on one side of the at least two real metal wiring layers distal from the base substrate — S200

Forming at least two real metal wiring layers on one side of a base substrate, and electrically connecting two of the real metal wiring layers through via holes — S100

Forming a plurality of periodically arranged real pixel units on one side of the at least two real metal wiring layers distal from the base substrate — S200

DISPLAY BACKPLANE, METHOD FOR MANUFACTURING THE SAME, AND DISPLAY APPARATUS

CROSS-REFERENCE TO RELATED APPLICATION

This application is a US national stage of international application No. PCT/CN2021/125611, filed on Oct. 22, 2021, which claims priority to Chinese Patent Application No. 202110321371.X, filed on Mar. 25, 2021, the disclosures of which are incorporated herein by reference in their entireties.

TECHNICAL FIELD

The present disclosure relates to the field of display technologies, and particularly relates to a display backplane, and a method for manufacturing the same, and a display apparatus.

BACKGROUND OF THE INVENTION

As a novel OLED display device, a micro-OLED display backplane has the characteristics of small size, high resolution and the like. The micro-OLED display backplane is manufactured by a mature integrated circuit CMOS process and realizes the active addressing of pixels; and the micro-OLED display backplane has a light weight since it includes various circuits such as a TCON circuit and an OCP circuit. Currently, the micro-OLED display backplane has been widely used in the field of near-to-eye display, virtual reality and augmented reality, especially in an AR/VR head-mounted display apparatus. At present, in a manufacturing process of the display backplane, on the one hand, it needs to have a relatively high PPI (pixels per inch), which is crucial for pixel arrangement and pixel area design of the OLED display device. On the other hand, in a manufacturing process of the OLED display device, in order to improve a display effect, the pixel arrangement has a decisive impact on the display of point, line and pattern. However, in a manufacturing process of a current display backplane, one module can only manufacture a display backplane with one pixel arrangement before a pixel unit is formed. If it is required to form a display backplane with different pixel arrangements to meet a customer's requirement or a product testing need, the design of a pixel driving circuit must be modified and the pixel driving circuit must be re-manufactured. Especially, when a position of a via hole is required to be changed, more photomasks are required in the manufacturing process, which sharply rises the manufacturing cost.

Therefore, the related art of the existing OLED display backplane still needs to be improved.

SUMMARY OF THE INVENTION

The present disclosure aims at solving one of technical problems in the related art at least to some extent. Therefore, an object of the present disclosure is to provide a display backplane that can realize different pixel arrangements without changing a position of a via hole therein and reduce design cost of a driving circuit in its manufacturing process, and that is a competitive product or suitable for product development and testing.

In one aspect of the present disclosure, a display backplane is provided by the present disclosure. According to embodiments of the present disclosure, the display backplane includes a base substrate and a plurality of real pixel units periodically arranged on one side of the base substrate, wherein each of the plurality of real pixel units has a plurality of real light-emitting layers with different colors, at least two real metal wiring layers are provided on one side of each of the plurality of real light-emitting layers proximal to the base substrate, and two real metal wiring layers on the side of each of the plurality of real light-emitting layers are electrically connected through via holes; and orthographic projections of the two real metal wiring layers on the side of each of the plurality of real light-emitting layers on the base substrate cover an orthographic projection of at least one of the via holes on the base substrate, and the via holes are configured to connect two virtual metal wiring layers in a virtual pixel unit different from the real pixel unit. This display backplane can realize different pixel arrangements without changing positions of the via holes therein, such that design cost of a driving circuit is reduced in a manufacturing process of the display backplane; and the display backplane is a competitive product, and meanwhile, is also suitable for product development and testing.

According to the embodiments of the present disclosure, the orthographic projections of the two real metal wiring layers on the side of each of the plurality of real light-emitting layers on the base substrate cover orthographic projections of two of the via holes on the base substrate.

According to the embodiments of the present disclosure, one real metal wiring layer on the side of each of the plurality of real light-emitting layers proximal to the base substrate is an anode of the each of the plurality of real light-emitting layers.

According to the embodiments of the present disclosure, each virtual pixel unit has a plurality of virtual light-emitting layers with different colors, and an overlapping region exists between an orthographic projection of each of the plurality of real light-emitting layer on the base substrate and an orthographic projection of one of the plurality of virtual light-emitting layers on the base substrate, and orthographic projections of the via holes on the base substrate are in the overlapping region.

According to the embodiments of the present disclosure, the plurality of real light-emitting layers in each real pixel unit include at least one first color real light-emitting layer, at least one second color real light-emitting layer and at least one third color real light-emitting layer, and the plurality of virtual light-emitting layers in each virtual pixel unit include at least one first color virtual light-emitting layer, at least one second color virtual light-emitting layer and at least one third color virtual light-emitting layer; a first overlapping region exists between an orthographic projection of the at least one first color real light-emitting layer on the base substrate and an orthographic projection of the at least one first color virtual light-emitting layer on the base substrate; a second overlapping region exists between an orthographic projection of the at least one second color real light-emitting layer on the base substrate and an orthographic projection of the at least one second color virtual light-emitting layer on the base substrate; a third overlapping region exists between an orthographic projection of the at least one third color real light-emitting layer on the base substrate and an orthographic projection of the at least one third color virtual light-emitting layer on the base substrate; and the orthographic projections of the via holes on the base substrate are disposed in the first overlapping region, the second overlapping region and the third overlapping region.

According to the embodiments of the present disclosure, the plurality of virtual light-emitting layers in each virtual pixel unit include two third color virtual light-emitting layers, the third overlapping region exists between an orthographic projection of the third color real light-emitting layer on the base substrate and an orthographic projection of one third color virtual light-emitting layer on the base substrate, no third overlapping region exists between the orthographic projection of the third color real light-emitting layer on the base substrate and an orthographic projection of the other third color virtual light-emitting layer on the base substrate, and the two third color virtual light-emitting layers share the same anode.

According to the embodiments of the present disclosure, an anode is provided on a surface of each of the plurality of real light-emitting layers proximal to the base substrate, a first real metal wiring layer is provided on one side of each anode proximal to the base substrate, a second real metal wiring layer is provided on one side of each first real metal wiring layer proximal to the base substrate, the via holes include a first via hole and a second via hole, each anode and each first real metal wiring layer are electrically connected through the first via hole, and each first real metal wiring layer and each second real metal wiring layer are electrically connected through the second via hole; an orthographic projection of each anode on the base substrate and an orthographic projection of each first real metal wiring layer on the base substrate cover an orthographic projection of at least one first via hole on the base substrate; and an orthographic projection of each first real metal wiring layer on the base substrate and an orthographic projection of each second real metal wiring layer on the base substrate cover an orthographic projection of at least one second via hole on the base substrate.

According to the embodiments of the present disclosure, one of the real pixel unit and the virtual pixel unit is in a Delta pixel arrangement, and the other of the real pixel unit and the virtual pixel unit is in an RBBG pixel arrangement.

According to the embodiments of the present disclosure, in the Delta pixel arrangement, a shape of the plurality of real light-emitting layers is a hexagon, an angle of an inner angle of the hexagon is 120 degrees, a pixel center distance is 6.3 μm, a pixel width W is 6.3 μm, a pixel height L is 6.3 μm, and a size of each sub-pixel is 4.2 μm×3.15 μm.

According to the embodiments of the present disclosure, in the RBBG pixel arrangement, a shape of the plurality of real light-emitting layers is a rectangle, a pixel center distance is 6.3 μm, a pixel width W is 6.3 μm, a pixel height L is 6.3 μm, and a size of each sub-pixel is 3.15 μm×3.15 μm.

In another aspect of the present disclosure, a method for manufacturing the aforementioned display backplane is provided by the present disclosure. According to the embodiments of the present disclosure, the method includes: forming at least two real metal wiring layers on one side of a base substrate, and electrically connecting two real metal wiring layers through via holes; and forming a plurality of real pixel units periodically arranged on one side of the at least two real metal wiring layers distal from the base substrate, wherein each of the plurality of real pixel units has a plurality of real light-emitting layers with different colors, orthographic projections of the two real metal wiring layers on one side of each of the plurality of real light-emitting layers proximal to the base substrate on the base substrate cover an orthographic projection of at least one via hole on the base substrate, and the via holes are configured to connect two virtual metal wiring layers in a virtual pixel unit different from the real pixel unit. This method is simple and convenient to operate, easy to implement, and easy for industrial production, and can effectively manufacture the aforementioned display backplane.

In another aspect of the present disclosure, a display apparatus is provided by the present disclosure. According to the embodiments of the present disclosure, the display apparatus includes the aforementioned display backplane. The display apparatus can realize different pixel arrangements without changing positions of via holes therein, such that design cost of a driving circuit is reduced in a manufacturing process of the display apparatus; and the display apparatus is a competitive product, meanwhile, is also suitable for product development and testing, and moreover, has all the features and advantages of the aforementioned display backplane, which is not repeated herein.

BRIEF DESCRIPTION OF DRAWINGS

FIG. 11 shows a flowchart of a method for manufacturing a display backplane according to an embodiment of the present disclosure.

REFERENCE NUMERALS

A: real pixel unit; B: virtual pixel unit; 10: real pixel unit; 11: first color real light-emitting layer; 12: second color real light-emitting layer; 13: third color real light-emitting layer; 20: virtual pixel unit; 21: first color virtual light-emitting layer; 22: second color virtual light-emitting layer; 23*a*, 23*b*: third color virtual light-emitting layer; 100*a*, 100*b*: first overlapping region; 200*a*, 200*b*: second overlapping region; 300*a*, 300*b*, 300*c*: third overlapping region; 51: first via hole; 52: second via hole; 55: via hole; 111, 222, 333: real metal wiring layer; 400: insulating layer; and 110, 120, 130, 210, 220, 230: anode.

DETAILED DESCRIPTION

The embodiments of the present disclosure are repeated below. The embodiments described below are exemplary and are only used to explain the present disclosure, and should not be construed as limiting the present disclosure. If particular technologies or conditions are not specified in the embodiments, it shall be carried out according to technologies or conditions described in documents in the art or according to the product specification.

Figure 2:
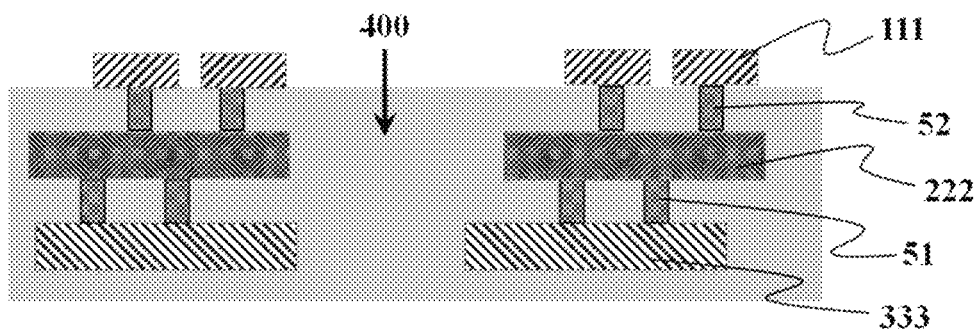
FIG. 2 shows a schematic cross-sectional structure diagram of via holes and real metal wiring layers in a display backplane according to an embodiment of the present disclosure.
Figure 3:
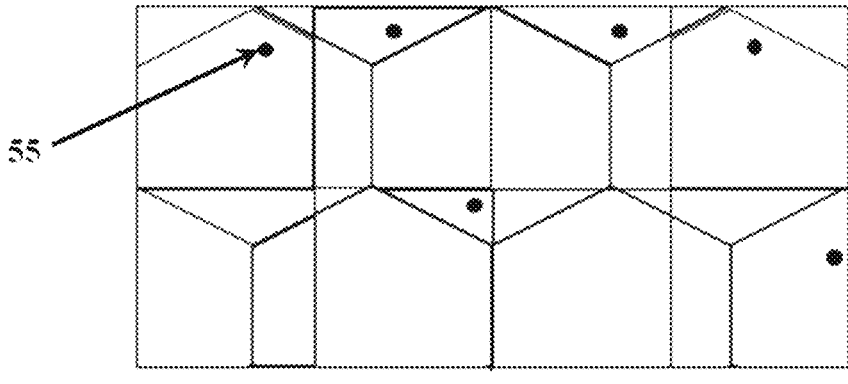
FIG. 3 shows a schematic planar structure diagram of via holes, an orthographic projection of a real pixel unit on a base substrate and an orthographic projection of a virtual pixel unit on the base substrate in a display backplane according to an embodiment of the present disclosure.

In one aspect of the present disclosure, a display backplane is provided by the present disclosure. According to an embodiment of the present disclosure, referring to FIG. 1, the display backplane includes a base substrate (not shown in the figures, which will not be repeated hereinafter) and a plurality of real pixel units A periodically arranged on one side of the base substrate. Each real pixel unit A has a plurality of real light-emitting layers (for example, each hexagon in the real pixel unit A shown in FIG. 1 may be understood as one of the real light-emitting layers) with different colors. At least two real metal wiring layers are provided on one side of each real light-emitting layer proximal to the base substrate (refer to FIG. 2 for the schematic structural diagram). It should be noted that three real metal wiring layers 111, 222 and 333 are shown in FIG. 2, but it is understandable that there may be only two real metal wiring layers. Two of the real metal wiring layers on the side of each real light-emitting layer are electrically connected through via holes. Refer to FIG. 2 for the schematic structural diagram, for example, they are a first via hole 51 and a second via hole 52 in FIG. 2. It is understandable by those skilled in the art that in a case that there are only two real metal wiring layers, there may be only one via hole. Orthographic projections of the two real metal wiring layers (not shown in FIG. 1) on the side of each real light-emitting layer on the base substrate cover an orthographic projection of at least one of the via holes 55 on the base substrate (refer to FIG. 3 for the schematic structural diagram), and the via hole is configured to connect two virtual metal wiring layers in a virtual pixel unit B different from the real pixel unit A. In the display backplane, the via holes may be configured to connect not only two real metal wiring layers in the real pixel unit A but also two virtual metal wiring layers in the virtual pixel unit B different from the real pixel unit A, such that this display backplane can realize different pixel arrangements without changing positions of the via holes therein. Thus, design cost of a driving circuit is reduced in a manufacturing process of the display backplane; and the display backplane is a competitive product, and meanwhile, is also suitable for product development and testing.

According to the embodiments of the present disclosure, it should be noted that the virtual pixel unit B does not belong to a part of the display backplane, nor does it belong to a structure independent of the display backplane. From the foregoing descriptions, it is understandable that the virtual pixel unit B is just in a pixel arrangement different from that of the real pixel unit A, and it is called the virtual pixel unit B because it does not belong to pixel units existing in an entity. The virtual pixel unit B is just a definition introduced in this document for the convenience of description. The definition is that a pixel unit may be called the virtual pixel unit B as long as a pixel arrangement of a pixel unit differs from that of the real pixel unit A and the via hole 55 in the display backplane may be configured to connect two metal wiring layers in the pixel unit.

Figure 1:
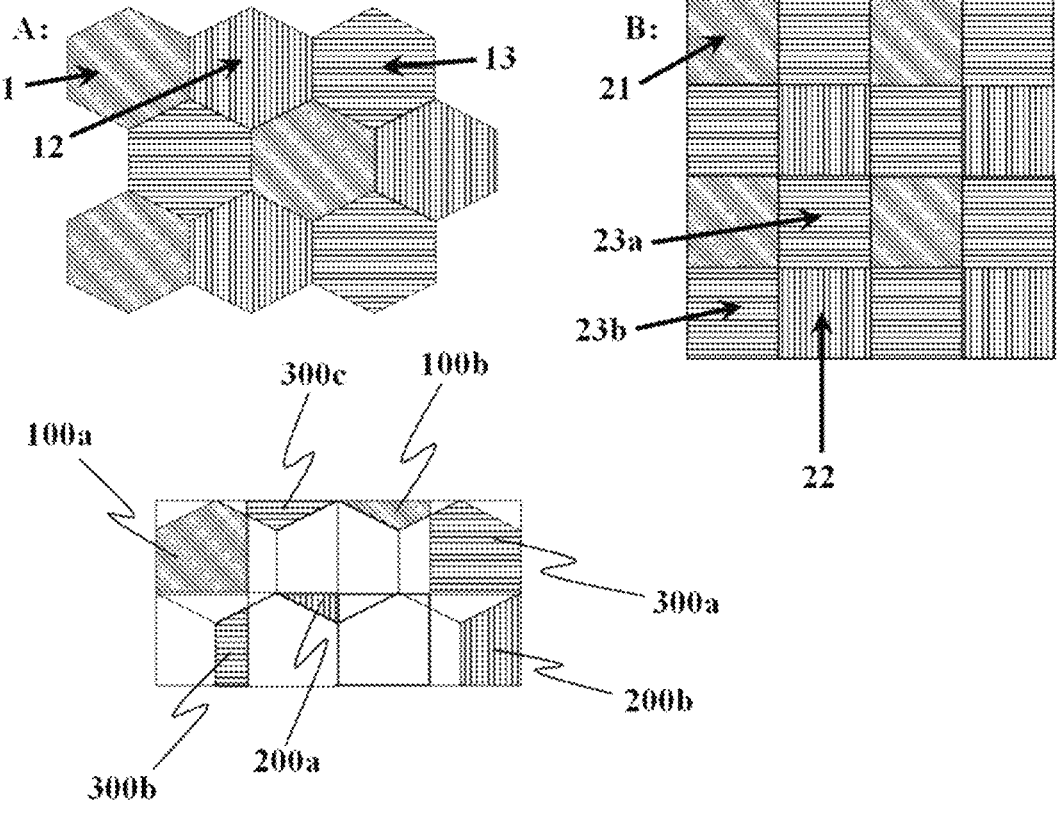
FIG. 1 shows schematic planar structure diagrams of a real pixel unit in a display backplane, a virtual pixel unit in the display backplane, and an orthographic projection of the real pixel unit on a base substrate and an orthographic projection of the virtual pixel unit on the base substrate in a display backplane according to an embodiment of the present disclosure.

According to the embodiments of the present disclosure, it should be noted that both the real pixel unit A and the virtual pixel unit B shown in FIG. 1 are taken as examples for description in the present disclosure, but those skilled in the art can understand that the real pixel unit and the virtual pixel unit described in the present disclosure are not limited to the structures shown in FIG. 1. For example, in other embodiments of the present disclosure, the pixel arrangement mode of the real pixel unit may also be the pixel arrangement mode shown in B in FIG. 1, or another arrangement mode not shown in the present disclosure. Correspondingly, the pixel arrangement mode of the virtual pixel unit may also be the pixel arrangement mode shown in A in FIG. 1, or another arrangement mode not shown in the present disclosure, as long as via holes thereof can meet the above-mentioned common condition, which will not be repeated hereinafter.

According to the embodiments of the present disclosure, a structure, material, thickness, and the like of the base substrate in the display backplane may be those of a conventional base substrate in the related art, and are not repeated herein. In addition, it is understandable that there may be a structure of a conventional display backplane in the related art between the base substrate and the real pixel unit, such as a thin film transistor and an insulating layer, which are not repeated herein.

Figure 5:
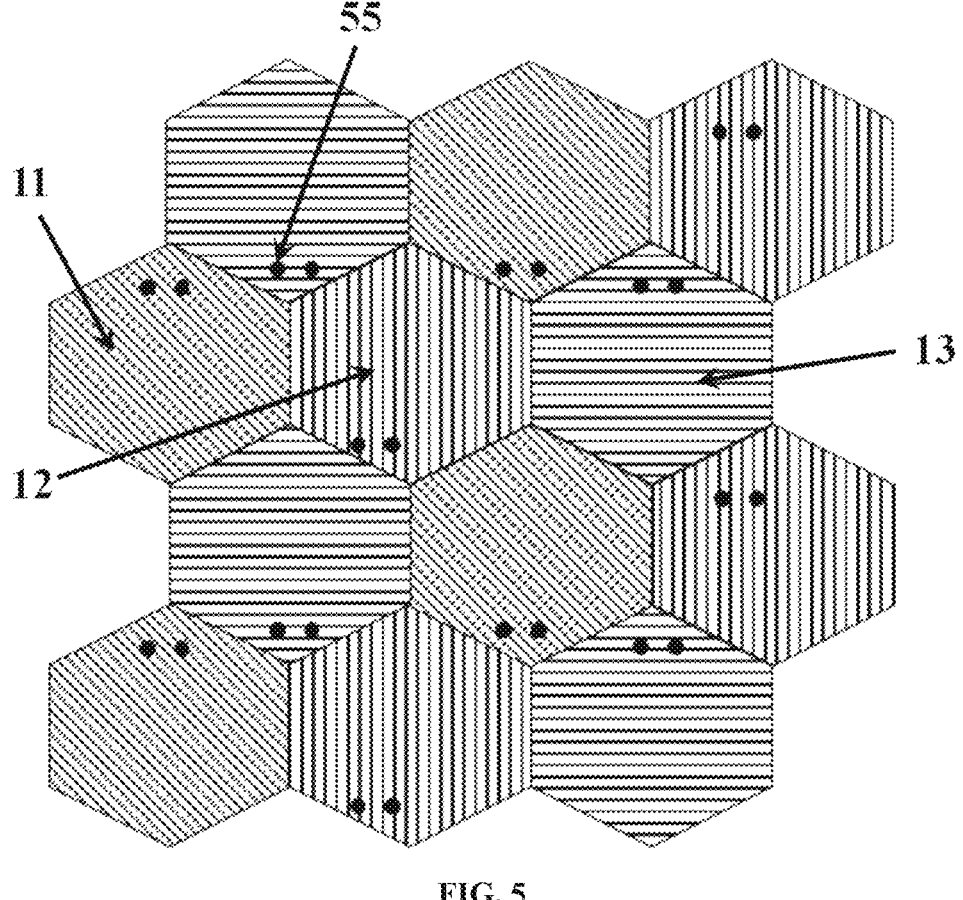
FIG. 5 shows a schematic planar structure diagram of a real pixel unit in a display backplane according to another embodiment of the present disclosure.

According to the embodiments of the present disclosure, it is understandable that, referring to FIGS. 1 and 5, each real light-emitting layer in each real pixel unit A may include at least one first color real light-emitting layer 11, at least one second color real light-emitting layer 12 and at least one third color real light-emitting layer 13. The first color real light-emitting layer 11 is a real light-emitting layer for displaying a first color, the second color real light-emitting layer 12 is a real light-emitting layer for displaying a second color, and the third color real light-emitting layer 13 is a real light-emitting layer for displaying a third color. In some embodiments of the present disclosure, the first color may be red (R), the second color may be green (G), and the third color may be blue (B). Of course, it is understandable that the first color, the second color and the third color may also be other colors, which will not be repeated herein.

According to the embodiments of the present disclosure, the particular type of the real metal wiring layer on the side of each real light-emitting layer proximal to the base substrate is not specifically limited, and the real metal wiring layer may be only a metal wiring layer in a pixel driving circuit in the display backplane or an anode of the real light-emitting layer in the display backplane. Thus, the display backplane is simple in structure and easy to implement. The via holes may not only be configured to connect an anode in the real pixel unit A to one real metal wiring layer but may also be configured to connect an anode in the virtual pixel unit B different from the real pixel unit A to one virtual metal wiring layer. Therefore, this display backplane can realize different pixel arrangements without changing positions of the via holes therein.

Figure 4:
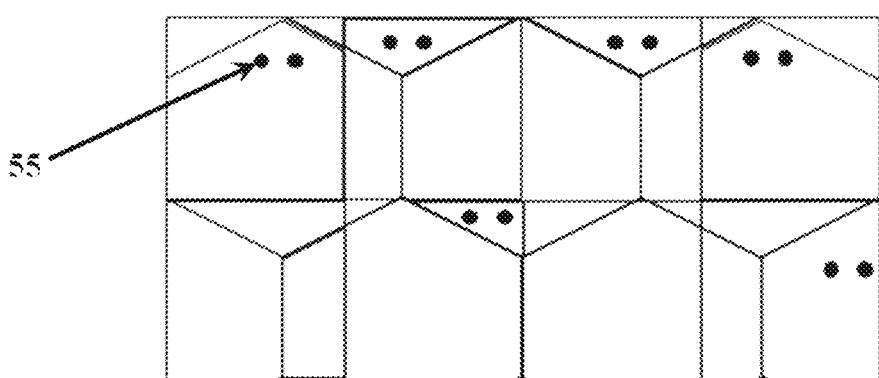
FIG. 4 shows a schematic planar structure diagram of via holes, an orthographic projection of a real pixel unit on a base substrate and an orthographic projection of a virtual pixel unit on the base substrate in a display backplane according to another embodiment of the present disclosure.

According to the embodiments of the present disclosure, the number of the via holes is not specifically limited. In some embodiments of the present disclosure, orthographic projections of the two real metal wiring layers on one side of each real light-emitting layer on the base substrate may cover an orthographic projection of only one via hole 55 on the base substrate (refer to FIG. 3 for the schematic structural diagram). In other embodiments of the present disclosure, orthographic projections of the two real metal wiring layers on one side of each real light-emitting layer on the base substrate may also cover orthographic projections of two via holes 55 on the base substrate (refer to FIG. 4 for the schematic structural diagram). It is understandable that in a case that the orthographic projections of the above real metal wiring layers cover the orthographic projections of the two via holes 55, because there are two electrical connection points between metal wiring layers, the electrical connection can be more stable, which prevents a defect caused by a disconnection when there is only one electrical connection point. Thus, a display effect of the display backplane is more stable.

According to the embodiments of the present disclosure, the particular structure of the virtual pixel unit is not specifically limited. Particularly, referring to FIGS. 1 and 6, each of the virtual pixel units may have a plurality of virtual light-emitting layers with different colors. On this premise, referring to FIGS. 1, 3, 4, 5 and 6, the position of the via hole 55 may be that there is an overlapping region between the orthographic projection of each real light-emitting layer on the base substrate and the orthographic projection of one virtual light-emitting layer on the base substrate, and the orthographic projection of the via hole 55 on the base substrate is in the overlapping region. Thus, the display backplane is simple in structure and easy to implement. The via holes may not only be configured to connect an anode in the real pixel unit A to one real metal wiring layer but also may be configured to connect an anode in the virtual pixel unit B different from the real pixel unit A to one virtual metal wiring layer. Therefore, this display backplane can realize different pixel arrangements without changing positions of the via holes therein.

Figure 6:
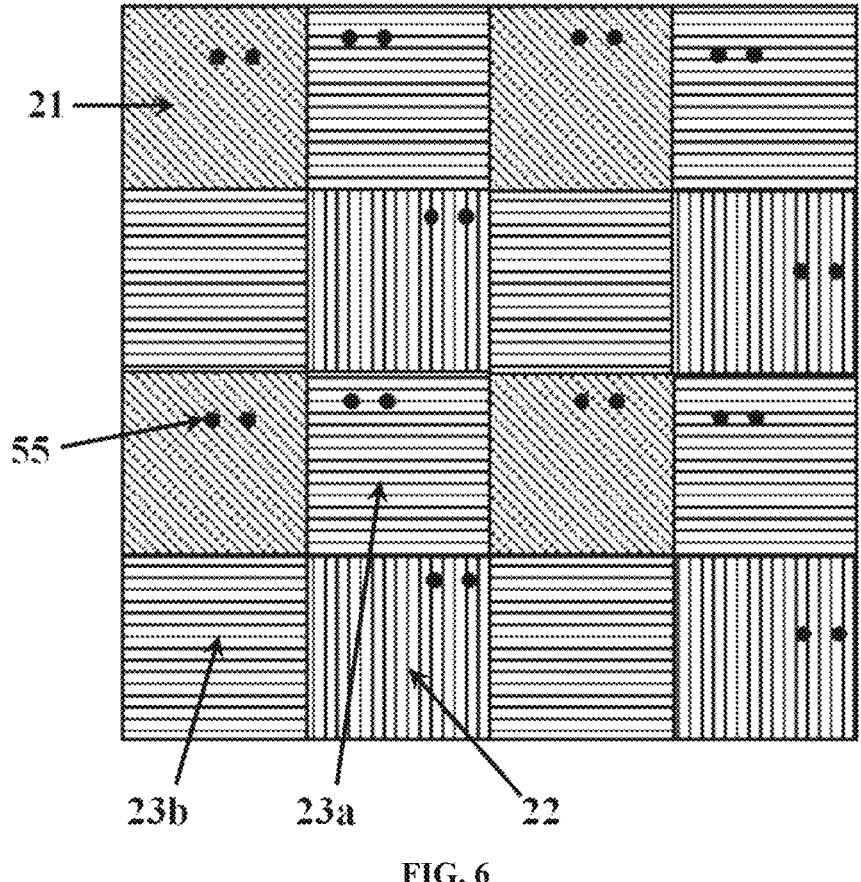
FIG. 6 shows a schematic planar structure diagram of a virtual pixel unit in a display backplane according to another embodiment of the present disclosure.

According to the embodiments of the present disclosure, further referring to FIGS. 1, 5 and 6, it is understandable that the virtual light-emitting layers in each virtual pixel unit further include at least one first color virtual light-emitting layer 21, at least one second color virtual light-emitting layer 22 and at least one third color virtual light-emitting layer 23a (it should be noted that in the figures of the present disclosure, in addition to the aforementioned third color virtual light-emitting layer 23a, a third color virtual light-emitting layer 23b is also shown, but those skilled in the art can understand that there may only one third color virtual light-emitting layer herein, which will not be repeated hereinafter). First overlapping regions 100a and 100b exist between the orthographic projection of the first color real light-emitting layer 11 on the base substrate and the orthographic projection of the first color virtual light-emitting layer 21 on the base substrate. Second overlapping regions 200a and 200b exist between the orthographic projection of the second color real light-emitting layer 12 on the base substrate and the orthographic projection of the second color virtual light-emitting layer 22 on the base substrate. Third overlapping regions 300a, 300b and 300c exist between the orthographic projection of the third color real light-emitting layer 13 on the base substrate and the orthographic projections of the third color virtual light-emitting layers 23a and 23b on the base substrate. Referring to FIGS. 3, 4, 5 and 6, the orthographic projections of the via holes 55 on the base substrate are in the first overlapping regions 100a and 100b, the second overlapping regions 200a and 200b and the third overlapping regions 300a, 300b and 300c. Thus, because the real light-emitting layers with the same color in the real pixel unit and the virtual pixel unit share the via hole with the metal wiring layer on one side of the virtual light-emitting layer, the display effect can be more easily controlled and more stable, and the display backplane can further realize different pixel arrangements without changing the positions of the via holes therein.

Figure 7:
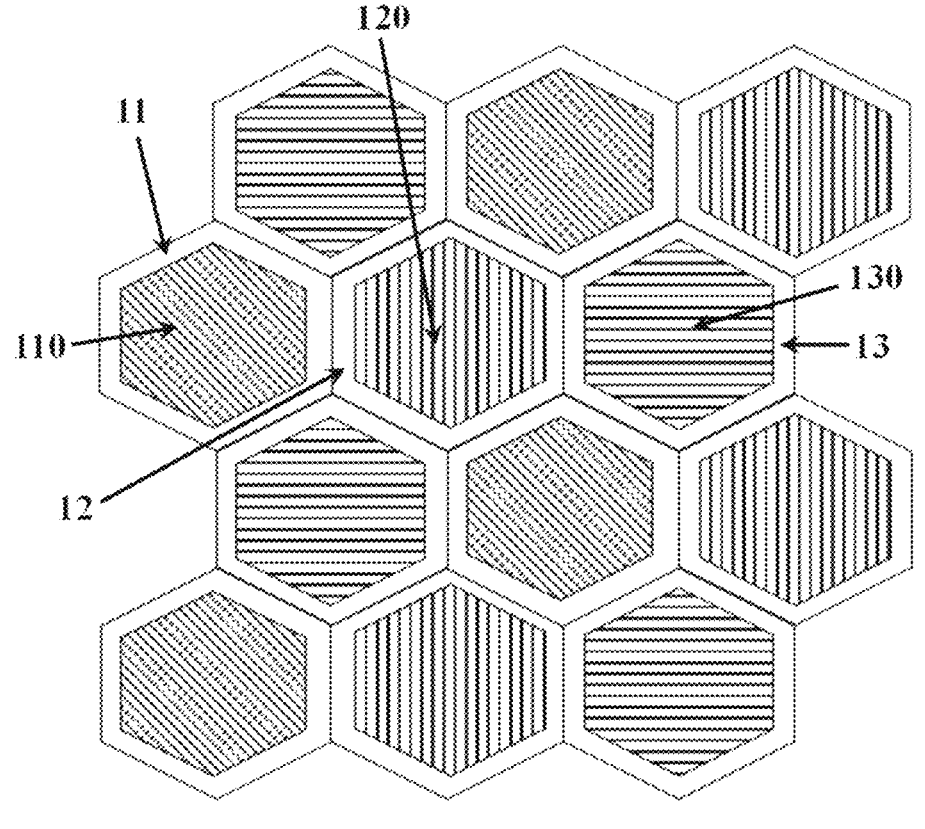
FIG. 7 shows a schematic planar structure diagram of a real pixel unit in a display backplane according to yet another embodiment of the present disclosure.
Figure 8:
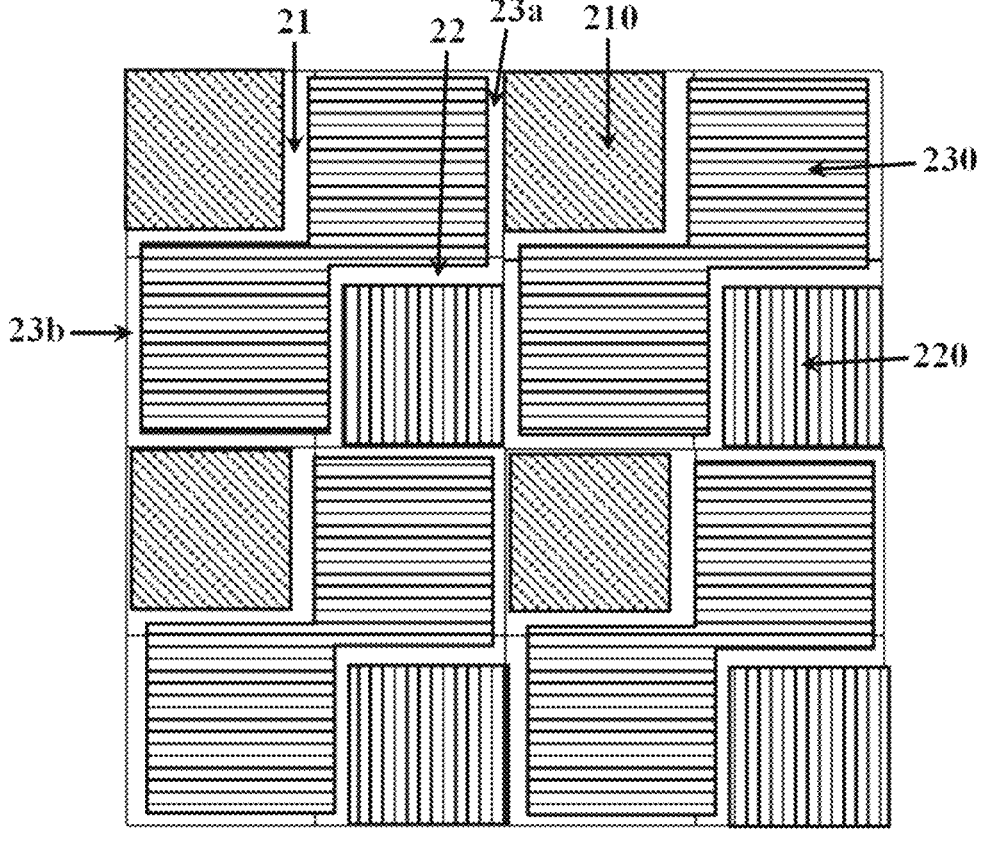
FIG. 8 shows a schematic planar structure diagram of a virtual pixel unit in a display backplane according to yet another embodiment of the present disclosure.

According to other embodiments of the present disclosure, referring to FIG. 1, the virtual light-emitting layers in each virtual pixel unit include two third color virtual light-emitting layers 23a and 23b. The third overlapping region 300c exists between the orthographic projection of the third color real light-emitting layer 13 on the base substrate and an orthographic projection of one third color virtual light-emitting layer 23a on the base substrate, and no third overlapping region exists between the orthographic projection of the third color real light-emitting layer 13 on the base substrate and an orthographic projection of the other third color virtual light-emitting layer 23b on the base substrate. The two third color virtual light-emitting layers 23a and 23b may share the same anode (refer to FIG. 8 for the schematic structural diagram, and in addition, refer to FIG. 7 for the schematic structural diagram of the anode in the real pixel unit). It is understandable that the third color virtual light-emitting layer may be a blue light-emitting layer. When the third color virtual light-emitting layer is the blue light-emitting layer, an area of a light-emitting layer in blue sub-pixels is increased such that the light-emitting life of the display backplane is relatively long.

In a particular embodiment of the present disclosure, referring to FIG. 2, an anode (for example, the real wiring layer 111 in FIG. 2) is provided on a surface of each real light-emitting layer proximal to the base substrate; a first real metal wiring layer (for example, the real wiring layer 222 in FIG. 2) is provided on one side of each anode proximal to the base substrate; and a second real metal wiring layer (for example, the real wiring layer 333 in FIG. 2) is provided on one side of each first real metal wiring layer proximal to the base substrate. The via holes include a first via hole 51 and a second via hole 52, each anode and each first real metal wiring layer are electrically connected through the second via hole 52, and each first real metal wiring layer and each second real metal wiring layer are electrically connected through the first via hole 51. Those skilled in the art can understand herein that each anode and each first real metal wiring layer may be electrically connected through the first via hole, and each first real metal wiring layer and each second real metal wiring layer may be electrically connected through the second via hole, which will not be repeated hereinafter. An orthographic projection of each anode on the base substrate and an orthographic projection of each first real metal wiring layer on the base substrate cover an orthographic projection of at least one of the second via holes on the base substrate. An orthographic projection of each first real metal wiring layer on the base substrate and an orthographic projection of each second real metal wiring layer on the base substrate cover an orthographic projection of at least one of the first via holes on the base substrate. Thus, the display backplane is simple in structure and easy to implement. The via holes may not only be configured to connect an anode in the real pixel unit to one real metal wiring layer, and connect one real metal wiring layer to another real metal wiring layer, but may also be configured to connect an anode in the virtual pixel unit different from the real pixel unit to one virtual metal wiring layer, and connect one virtual metal wiring layer to another virtual metal wiring layer. Therefore, this display backplane can realize different pixel arrangements without changing positions of the via holes therein.

Figure 9:
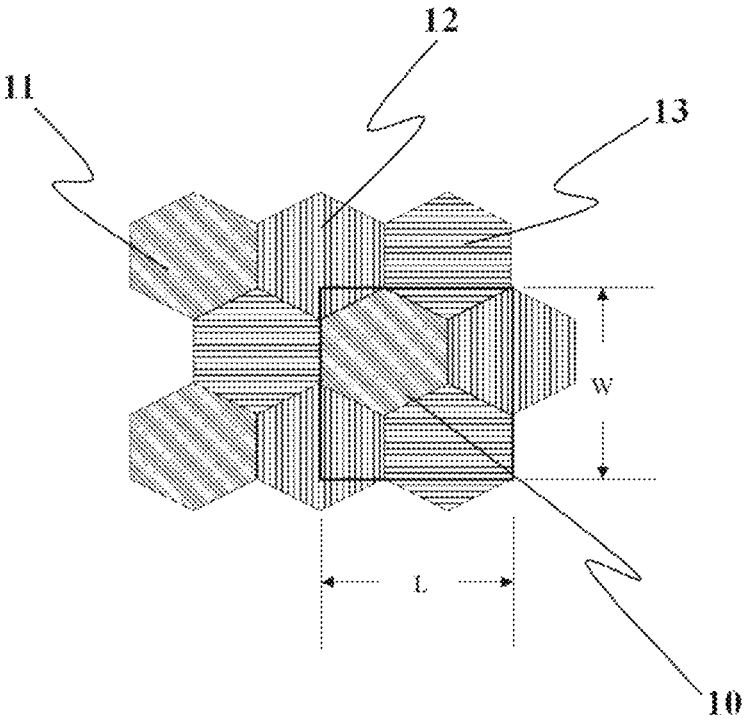
FIG. 9 shows a schematic planar structure diagram of a real pixel unit in a display backplane according to still another embodiment of the present disclosure.

According to the embodiments of the present disclosure, furthermore, the particular structures of the real pixel unit and the virtual pixel unit are not specifically limited. In some embodiments of the present disclosure, one of the real pixel unit and the virtual pixel unit is in a Delta pixel arrangement, and the other is in an RBBG pixel arrangement. More particularly, referring to FIG. 9, in the Delta pixel arrangement, the shape of the plurality of real light-emitting layers may be a hexagon. The angle of each inner angle of the hexagon may be 120 degrees, the pixel center distance may be 6.3 μm, the pixel width W may be 6.3 μm, the pixel height L may be 6.3 μm, and the size of each sub-pixel may be 4.2 μm×3.15 μm. Thus, the alternate arrangement of the plurality of real light-emitting layers is beneficial to improving the display effect.

Figure 10:
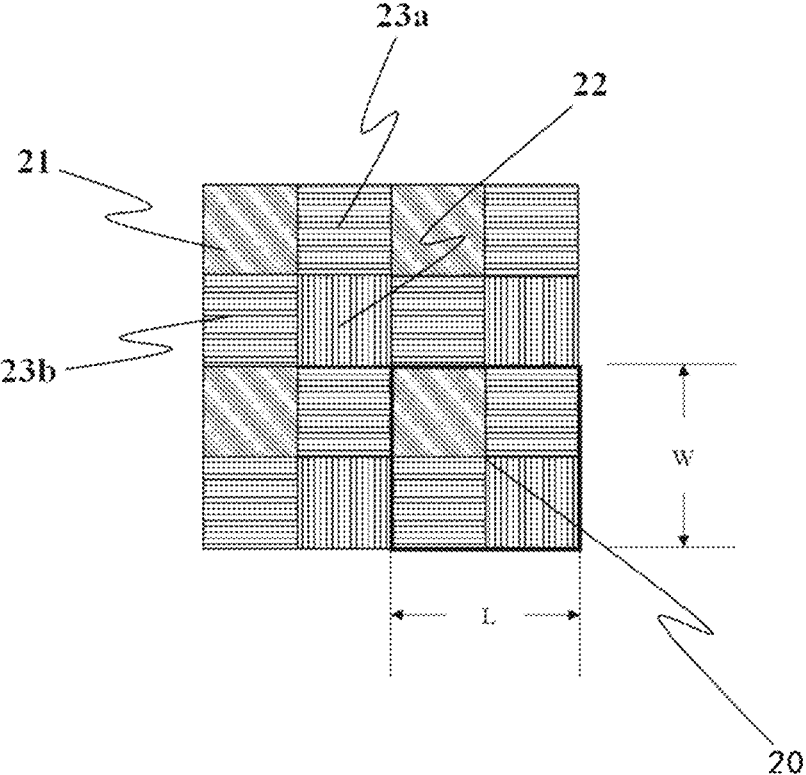
FIG. 10 shows a schematic planar structure diagram of a virtual pixel unit in a display backplane according to still another embodiment of the present disclosure.

According to the embodiments of the present disclosure, in addition, referring to FIG. 10, in the RBBG pixel arrangement, the shape of the plurality of real light-emitting layers may be a rectangle, the pixel center distance may be 6.3 μm, the pixel width W may be 6.3 μm, the pixel height L may be 6.3 μm, and the size of each sub-pixel may be 3.15 μm×3.15 μm. The rectangle may be square or rectangular, such that an area of light-emitting layers in sub-pixels of the virtual pixel unit B is increased to prolong the service life. In addition, the alternate arrangement of the plurality of real light-emitting layers is beneficial to improving the display effect.

According to the embodiments of the present disclosure, it is understandable that in the display backplane provided by the present disclosure, both structures and components not mentioned above may be the same as those of a conventional display backplane in the related art, and the details are not repeated herein.

In another aspect of the present disclosure, a method for manufacturing the aforementioned display backplane is provided by the present disclosure. According to the embodiments of the present disclosure, the method may particularly include the following steps.

In S100, at least two real metal wiring layers are formed on one side of a base substrate, and two of the real metal wiring layers are electrically connected through via holes.

According to the embodiments of the present disclosure, the process of forming at least two real metal wiring layers on one side of the base substrate and electrically connecting two of the real metal wiring layers through via holes is a conventional process of forming metal wiring layers and punching holes in the related art, and particular process parameters thereof may all be conventional process parameters, which are not repeated herein. Therefore, the manufacturing process is simple, convenient, easy to implement and easy for industrial production.

In S200, a plurality of periodically arranged real pixel units is formed on one side of the at least two real metal wiring layers distal from the base substrate, wherein each real pixel unit has a plurality of real light-emitting layers with different colors, orthographic projections of the two real metal wiring layers on one side of each real light-emitting layer proximal to the base substrate on the base substrate cover an orthographic projection of at least one of the via holes on the base substrate, and the via hole is configured to connect two virtual metal wiring layers in a virtual pixel unit different from the real pixel unit.

According to the embodiments of the present disclosure, the specific process of forming a plurality of real pixel units periodically arranged on one side of the at least two real metal wiring layers distal from the base substrate may be a conventional process of forming a plurality of real pixel units which are periodically arranged in the related art, and the particular process parameters thereof may all be conventional process parameters, which are not repeated herein. Therefore, the manufacturing process is simple, convenient, easy to implement, easy for industrial production, and can effectively manufacture the aforementioned display backplane.

In another aspect of the present disclosure, a display apparatus is provided by the present disclosure. According to the embodiments of the present disclosure, the display apparatus includes the aforementioned display backplane. The display apparatus can realize different pixel arrangements without changing positions of via holes therein, such that design cost of a driving circuit is reduced in a manufacturing process of the display apparatus; and the display apparatus is a competitive product, meanwhile, is also suitable for product development and testing, and moreover, has all the features and advantages of the aforementioned display backplane, which are not repeated herein.

According to the embodiments of the present disclosure, the display apparatus includes other necessary structures and components in addition to the aforementioned display backplane, which may be supplemented and designed by those skilled in the art based on a particular type and use requirement of the display apparatus, and are not repeated herein.

According to the embodiments of the present disclosure, the particular types of the display apparatus are not specifically limited. For example, the display apparatus includes, but is not limited to, a mobile phone, a tablet computer, a wearable device, a game machine, a television or a vehicle-mounted display, etc.

In the description of the present disclosure, it should be understood that the terms "first" and "second" are only used for a descriptive purpose, and shall not be understood as indicating or implying relative importance or implicitly indicating the quantity of indicated technical features. Therefore, the features defined as "first" and "second" may include one or more of these features explicitly or implicitly. In the description of the present disclosure, unless otherwise particularly stated, "a plurality of" means two or more.

In the description of the Description, the description referring to the terms such as "one embodiment", "some embodiments", "example", "particular example" or "some examples" are intended to indicate that a particular feature, structure, material or characteristic described in combination with this embodiment or example is included in at least one embodiment or example of the present disclosure. In the Description, the schematic expressions of the above terms are not necessarily aimed at the same embodiment or example. In addition, the particular feature, structure, material or characteristic described may be combined in any one or more embodiments or examples in a suitable fashion. In addition, those skilled in the art can combine and compose different embodiments or examples and features of different embodiments or examples described in this Description without contradicting each other.

Although the embodiments of the present disclosure have been shown and described above, it is understandable that the above embodiments are exemplary and cannot be construed as limiting the present disclosure, and those skilled in the art can make changes, modifications, substitutions and variations to the above embodiments within the scope of the present disclosure.

The invention claimed is:

1. A display backplane, comprising a base substrate and a plurality of real pixel units periodically arranged on one side of the base substrate, wherein each of the plurality of real pixel units has a plurality of real light-emitting layers with different colors, at least two real metal wiring layers are provided on one side of each of the plurality of real light-emitting layers proximal to the base substrate, and two real metal wiring layers on the side of each of the plurality of real light-emitting layers are electrically connected through via holes; and orthographic projections of the two real metal wiring layers on the side of each of the plurality of real light-emitting layers on the base substrate cover an orthographic projection of at least one of the via holes on the base substrate, and the via holes are configured to connect two virtual metal wiring layers in a virtual pixel unit different from the real pixel unit.

2. The display backplane according to claim 1, wherein the orthographic projections of the two real metal wiring layers on the side of each of the plurality of real light-emitting layers on the base substrate cover orthographic projections of two of the via holes on the base substrate.

3. The display backplane according to claim 2, wherein one real metal wiring layer on the side of each of the plurality of real light-emitting layers proximal to the base substrate is an anode of the each of the plurality of real light-emitting layers.

4. The display backplane according to claim 2, wherein each virtual pixel unit has a plurality of virtual light-emitting layers with different colors, and an overlapping region exists between an orthographic projection of each of the plurality of real light-emitting layers on the base substrate and an orthographic projection of one of the plurality of virtual light-emitting layers on the base substrate, and orthographic projections of the via holes on the base substrate are in the overlapping region.

5. The display backplane according to claim 2, wherein an anode is provided on a surface of each of the plurality of real light-emitting layers proximal to the base substrate, a first real metal wiring layer is provided on one side of each anode proximal to the base substrate, a second real metal wiring layer is provided on one side of each first real metal wiring layer proximal to the base substrate, the via holes comprise a first via hole and a second via hole, each anode and each first real metal wiring layer are electrically connected through the first via hole, and each first real metal wiring layer and each second real metal wiring layer are electrically connected through the second via hole;

an orthographic projection of each anode on the base substrate and an orthographic projection of each first real metal wiring layer on the base substrate cover an orthographic projection of at least one first via hole on the base substrate; and an orthographic projection of each first real metal wiring layer on the base substrate and an orthographic projection of each second real metal wiring layer on the base substrate cover an orthographic projection of at least one second via hole on the base substrate.

6. The display backplane according to claim 1, wherein one real metal wiring layer on the side of each of the plurality of real light-emitting layers proximal to the base substrate is an anode of the each of the plurality of real light-emitting layers.

7. The display backplane according to claim 6, wherein each virtual pixel unit has a plurality of virtual light-emitting layers with different colors, and an overlapping region exists between an orthographic projection of each of the plurality of real light-emitting layers on the base substrate and an orthographic projection of one of the plurality of virtual light-emitting layers on the base substrate, and orthographic projections of the via holes on the base substrate are in the overlapping region.

8. The display backplane according to claim 6, wherein an anode is provided on a surface of each of the plurality of real light-emitting layers proximal to the base substrate, a first real metal wiring layer is provided on one side of each anode proximal to the base substrate, a second real metal wiring layer is provided on one side of each first real metal wiring layer proximal to the base substrate, the via holes comprise a first via hole and a second via hole, each anode and each first real metal wiring layer are electrically connected through the first via hole, and each first real metal wiring layer and each second real metal wiring layer are electrically connected through the second via hole;

an orthographic projection of each anode on the base substrate and an orthographic projection of each first real metal wiring layer on the base substrate cover an orthographic projection of at least one first via hole on the base substrate; and an orthographic projection of each first real metal wiring layer on the base substrate and an orthographic projection of each second real metal wiring layer on the base substrate cover an orthographic projection of at least one second via hole on the base substrate.

9. The display backplane according to claim 1, wherein each virtual pixel unit has a plurality of virtual light-emitting layers with different colors, and an overlapping region exists between an orthographic projection of each of the plurality of real light-emitting layers on the base substrate and an orthographic projection of one of the plurality of virtual light-emitting layers on the base substrate, and orthographic projections of the via holes on the base substrate are in the overlapping region.

10. The display backplane according to claim 9, wherein the plurality of real light-emitting layers in each real pixel unit comprise at least one first color real light-emitting layer, at least one second color real light-emitting layer and at least one third color real light-emitting layer, and the plurality of virtual light-emitting layers in each virtual pixel unit comprise at least one first color virtual light-emitting layer, at least one second color virtual light-emitting layer and at least one third color virtual light-emitting layer;

a first overlapping region exists between an orthographic projection of the at least one first color real light-emitting layer on the base substrate and an orthographic projection of the at least one first color virtual light-emitting layer on the base substrate;

a second overlapping region exists between an orthographic projection of the at least one second color real light-emitting layer on the base substrate and an orthographic projection of the at least one second color virtual light-emitting layer on the base substrate;

a third overlapping region exists between an orthographic projection of the at least one third color real light-emitting layer on the base substrate and an orthographic projection of the at least one third color virtual light-emitting layer on the base substrate; and the orthographic projections of the via holes on the base substrate are in the first overlapping region, the second overlapping region and the third overlapping region.

11. The display backplane according to claim 10, wherein the plurality of virtual light-emitting layers in each virtual pixel unit comprise two third color virtual light-emitting layers, the third overlapping region exists between an orthographic projection of the third color real light-emitting layer on the base substrate and an orthographic projection of one third color virtual light-emitting layer on the base substrate, no third overlapping region exists between the orthographic projection of the third color real light-emitting layer on the base substrate and an orthographic projection of the other third color virtual light-emitting layer on the base substrate, and the two third color virtual light-emitting layers share the same anode.

12. The display backplane according to claim 11, wherein an anode is provided on a surface of each of the plurality of real light-emitting layers proximal to the base substrate, a first real metal wiring layer is provided on one side of each anode proximal to the base substrate, a second real metal wiring layer is provided on one side of each first real metal wiring layer proximal to the base substrate, the via holes comprise a first via hole and a second via hole, each anode and each first real metal wiring layer are electrically connected through the first via hole, and each first real metal wiring layer and each second real metal wiring layer are electrically connected through the second via hole;

an orthographic projection of each anode on the base substrate and an orthographic projection of each first real metal wiring layer on the base substrate cover an orthographic projection of at least one first via hole on the base substrate; and an orthographic projection of each first real metal wiring layer on the base substrate and an orthographic projection of each second real metal wiring layer on the base substrate cover an orthographic projection of at least one second via hole on the base substrate.

13. The display backplane according to claim 10, wherein an anode is provided on a surface of each of the plurality of real light-emitting layers proximal to the base substrate, a first real metal wiring layer is provided on one side of each anode proximal to the base substrate, a second real metal wiring layer is provided on one side of each first real metal wiring layer proximal to the base substrate, the via holes comprise a first via hole and a second via hole, each anode and each first real metal wiring layer are electrically connected through the first via hole, and each first real metal wiring layer and each second real metal wiring layer are electrically connected through the second via hole;

an orthographic projection of each anode on the base substrate and an orthographic projection of each first real metal wiring layer on the base substrate cover an orthographic projection of at least one first via hole on the base substrate; and an orthographic projection of each first real metal wiring layer on the base substrate and an orthographic projection of each second real metal wiring layer on the base substrate cover an orthographic projection of at least one second via hole on the base substrate.

14. The display backplane according to claim 9, wherein an anode is provided on a surface of each of the plurality of real light-emitting layers proximal to the base substrate, a first real metal wiring layer is provided on one side of each anode proximal to the base substrate, a second real metal wiring layer is provided on one side of each first real metal wiring layer proximal to the base substrate, the via holes comprise a first via hole and a second via hole, each anode and each first real metal wiring layer are electrically connected through the first via hole, and each first real metal wiring layer and each second real metal wiring layer are electrically connected through the second via hole;

an orthographic projection of each anode on the base substrate and an orthographic projection of each first real metal wiring layer on the base substrate cover an orthographic projection of at least one first via hole on the base substrate; and an orthographic projection of each first real metal wiring layer on the base substrate and an orthographic projection of each second real metal wiring layer on the base substrate cover an orthographic projection of at least one second via hole on the base substrate.

15. The display backplane according to claim 1, wherein an anode is provided on a surface of each of the plurality of real light-emitting layers proximal to the base substrate, a first real metal wiring layer is provided on one side of each anode proximal to the base substrate, a second real metal wiring layer is provided on one side of each first real metal wiring layer proximal to the base substrate, the via holes comprise a first via hole and a second via hole, each anode and each first real metal wiring layer are electrically connected through the first via hole, and each first real metal wiring layer and each second real metal wiring layer are electrically connected through the second via hole;

an orthographic projection of each anode on the base substrate and an orthographic projection of each first real metal wiring layer on the base substrate cover an orthographic projection of at least one first via hole on the base substrate; and an orthographic projection of each first real metal wiring layer on the base substrate and an orthographic projection of each second real metal wiring layer on the base substrate cover an orthographic projection of at least one second via hole on the base substrate.

16. The display backplane according to claim 1, wherein one of the real pixel unit and the virtual pixel unit is in a Delta pixel arrangement, and the other of the real pixel unit and the virtual pixel unit is in an RBBG pixel arrangement.

17. The display backplane according to claim 16, wherein in the Delta pixel arrangement, a shape of the plurality of real light-emitting layers is a hexagon, an angle of an inner angle of the hexagon is 120 degrees, a pixel center distance is 6.3 μm, a pixel width W is 6.3 μm, a pixel height L is 6.3 μm, and a size of each sub-pixel is 4.2 μm×3.15 μm.

18. The display backplane according to claim 16, wherein in the RBBG pixel arrangement, a shape of the plurality of real light-emitting layers is a rectangle, a pixel center distance is 6.3 μm, a pixel width W is 6.3 μm, a pixel height L is 6.3 μm, and a size of each sub-pixel is 3.15 μm×3.15 μm.

19. A method for manufacturing the display backplane according to claim 1, comprising:

forming at least two real metal wiring layers on one side of a base substrate, and electrically connecting two real metal wiring layers through via holes; and forming a plurality of real pixel units periodically arranged on one side of the at least two real metal wiring layers distal from the base substrate;

wherein each of the plurality of real pixel units has a plurality of real light-emitting layers with different colors, orthographic projections of the two real metal wiring layers on one side of each of the plurality of real light-emitting layers proximal to the base substrate on the base substrate cover an orthographic projection of at least one via hole on the base substrate, and the via holes are configured to connect two virtual metal wiring layers in a virtual pixel unit different from the real pixel unit.

20. A display apparatus, comprising the display backplane according to claim 1.

* * * * *